(12) United States Patent
Okamoto

(10) Patent No.: US 8,941,016 B2
(45) Date of Patent: Jan. 27, 2015

(54) LAMINATED WIRING BOARD AND MANUFACTURING METHOD FOR SAME

(71) Applicant: Fujikura Ltd., Koto-ku, Tokyo (JP)

(72) Inventor: Masahiro Okamoto, Sakita (JP)

(73) Assignee: Fujikura Ltd., Tokyo (JP)

( * ) Notice: Subject to any disclaimer, the term of this patent is extended or adjusted under 35 U.S.C. 154(b) by 218 days.

(21) Appl. No.: 13/734,474

(22) Filed: Jan. 4, 2013

(65) Prior Publication Data

US 2013/0118791 A1 May 16, 2013

Related U.S. Application Data

(63) Continuation of application No. PCT/JP2011/065336, filed on Jul. 5, 2011.

(30) Foreign Application Priority Data

Jul. 6, 2010 (JP) .................................. 2010-153738

(51) Int. Cl.
| H05K 1/16 | (2006.01) |
| H05K 1/09 | (2006.01) |
| H05K 1/00 | (2006.01) |
| H05K 1/02 | (2006.01) |
| H05K 1/11 | (2006.01) |
| H05K 1/18 | (2006.01) |
| H05K 3/30 | (2006.01) |
| H05K 3/32 | (2006.01) |
| H05K 3/46 | (2006.01) |

(52) U.S. Cl.
CPC ................. *H05K 1/183* (2013.01); *H05K 1/186* (2013.01); *H05K 3/321* (2013.01); *H05K 3/4623* (2013.01)
USPC ........... 174/260; 174/257; 174/258; 174/259; 174/261; 174/262; 361/761; 361/763; 29/832

(58) Field of Classification Search
USPC .............. 174/257–262; 361/761, 763; 29/832
See application file for complete search history.

(56) References Cited

U.S. PATENT DOCUMENTS

| 7,750,247 | B2 | 7/2010 | Chikagawa et al. | |
| 2004/0160752 | A1* | 8/2004 | Yamashita et al. | 361/766 |
| 2007/0158101 | A1* | 7/2007 | Chikagawa et al. | 174/260 |
| 2007/0263369 | A1* | 11/2007 | Takeuchi et al. | 361/760 |
| 2008/0151518 | A1* | 6/2008 | Hsu et al. | 361/762 |
| 2010/0149768 | A1* | 6/2010 | Takaike | 361/761 |
| 2011/0100691 | A1* | 5/2011 | Yugawa | 174/260 |

FOREIGN PATENT DOCUMENTS

| JP | 2005-142178 A | 6/2005 |
| JP | 2008-166456 A | 7/2008 |
| WO | 2006/046461 A1 | 5/2006 |

OTHER PUBLICATIONS

Office Action issued by Japanese Patent Office in Japanese Application No. 2012-523870 dated Jul. 2, 2013.

* cited by examiner

*Primary Examiner* — Timothy Thompson
*Assistant Examiner* — Sherman Ng
(74) *Attorney, Agent, or Firm* — Sughrue Mion, PLLC

(57) ABSTRACT

A laminated wiring board, includes: a first substrate in which a conductor circuit is formed on one surface of an insulating layer and an adhesive layer is formed on an other surface of the insulating layer, and conductors are formed in via holes that pass through the insulating layer and the adhesive layer so that the conductor circuit is partially exposed therefrom; an electronic component electrically connected to the conductor circuit by allowing electrodes of the electronic component to be connected to the conductors; an embedding member arranged around the electronic components so that the electronic component is embedded therein; and a second substrate having an adhesive layer laminated to face the adhesive layer of the first substrate and sandwich the electronic component and the embedding member, wherein each of the electrodes of the electronic component is continuous with the conductor circuit through two or more of the conductors.

11 Claims, 10 Drawing Sheets

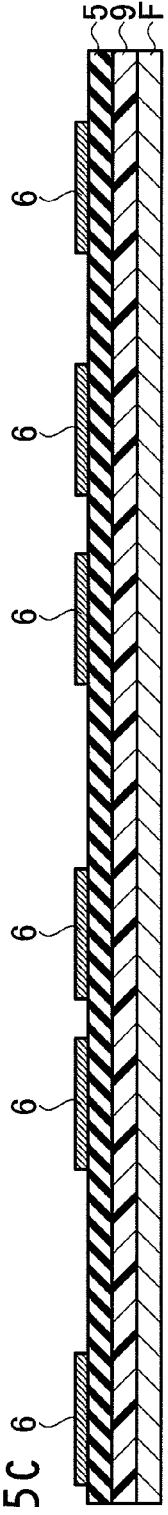
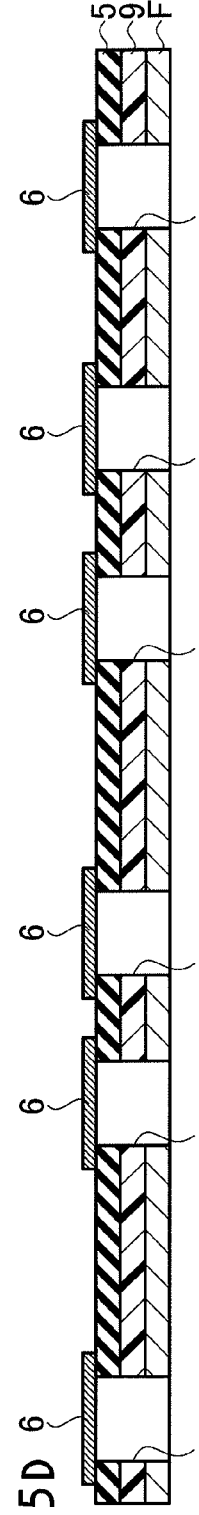
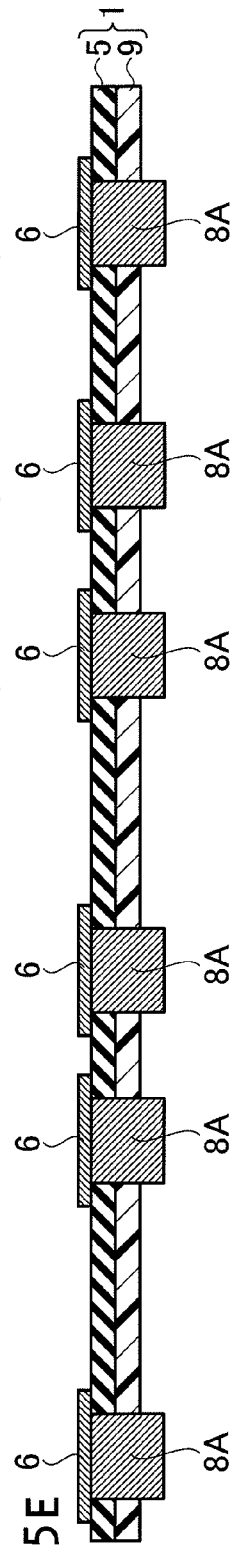
FIG. 5A
FIG. 5B
FIG. 5C
FIG. 5D
FIG. 5E

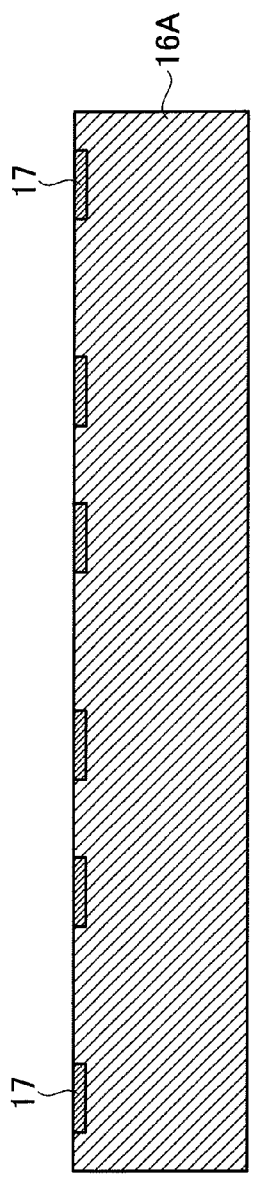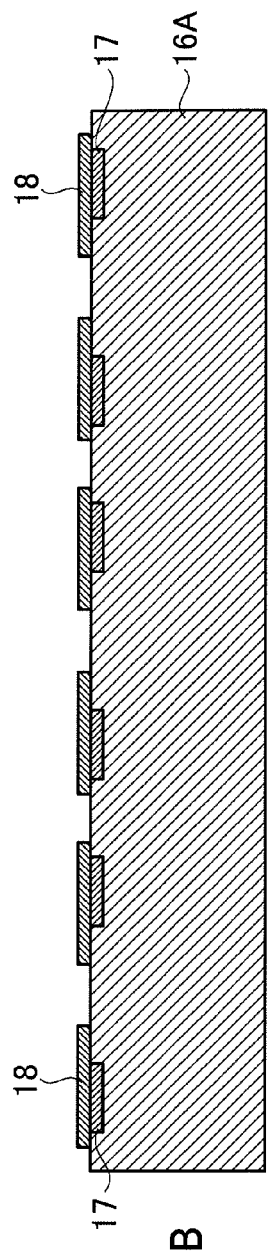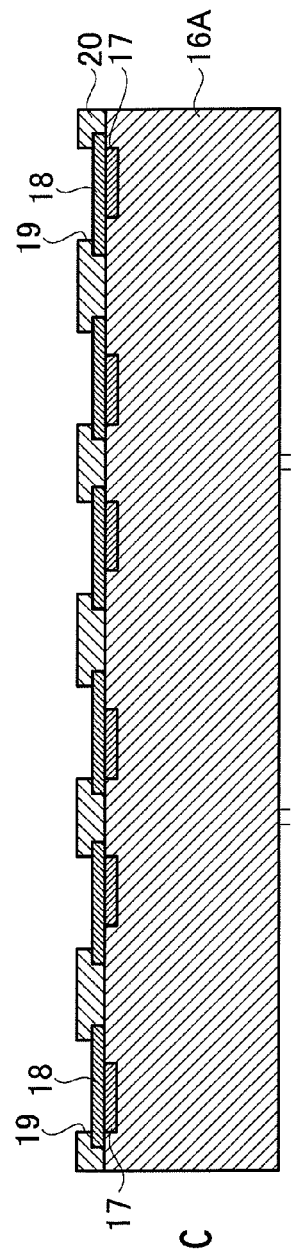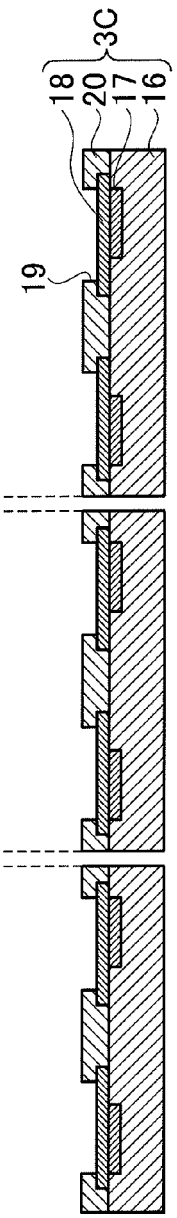

LAMINATED WIRING BOARD AND MANUFACTURING METHOD FOR SAME

CROSS-REFERENCE TO RELATED APPLICATIONS

The application is a Continuation of PCT Application No. PCT/JP2011/065336, filed on Jul. 5, 2011, and claims the benefit of priority from the prior Japanese Patent Applications No. 2010-153738, filed on Jul. 6, 2010, the entire contents of which are incorporated herein by reference.

BACKGROUND OF THE INVENTION

The present invention relates to a laminated wiring board and a manufacturing method for same, and particularly to a technology which inhibits displacement of an electric component embedded by an embedding member such as prepreg which is sandwiched between both substrates, and thus enhances reliability in electrical connection between an electrode of the electronic component and a conductor circuit.

With recent functional diversification of mobile electronic devices, there have been demands for further downsizing of semiconductor devices, and package size reduction has been focused on more than demands for higher integration of IC/LSI. In such a situation, reduction in size and thickness of printed wiring boards is desired.

For example, a technology with regard to a laminated wiring board has been disclosed in which a chip capacitor and a resistance element, which are mounted on a substrate, are embedded by being sandwiched by prepreg, and the chip capacitor and the resistance element are connected to wiring patterns formed on both surfaces of the prepreg, via through holes formed through the prepreg (see Japanese Patent Application Publication No. 2008-166456).

SUMMARY

In a laminated wiring board having a configuration in which an electronic component is embedded by being sandwiched by an embedding member such as prepreg, pressure applied when sandwiching the electronic component may cause displacement of the electronic component, which can cause deterioration of reliability in electrical connection between an electrode of the electronic component and an external electrode formed on the prepreg.

Therefore, the present invention aims to provide a laminated wiring board and a manufacturing method for same, which prevents displacement of an electronic component embedded by an embedding member such as prepreg that is sandwiched between both substrates, and thereby improves reliability in electrical connection between an electrode of the electronic component and an external electrode connected thereto.

A laminated wiring board according to claim 1 is characterized by including a first substrate in which a conductor circuit is formed on one surface of an insulating layer and an adhesive layer is formed on an other surface of the insulating layer, and conductors are respectively formed in a plurality of via holes that pass through the insulating layer and the adhesive layer so that the conductor circuit is partially exposed therefrom, an electronic component which is electrically connected to the conductor circuit by allowing electrodes of the electronic component to be connected to the conductors, respectively, an embedding member which is arranged around the electronic components so that the electronic component is embedded therein, and a second substrate which has an adhesive layer laminated so as to face the adhesive layer of the first substrate and sandwich the electronic component and the embedding member, wherein each of the electrodes of the electronic component is continuous with the conductor circuit through two or more of the conductors.

The invention according to claim 2 is the laminated wiring board set forth in claim 1, and is characterized in that the embedding member has an insulating layer and an adhesive layer that are laminated with an opening portion in which the electronic component is accommodated.

The invention according to claim 3 is the laminated wiring board set forth in claim 1, and is characterized in that the embedding member is made of prepreg which has an accommodating recessed portion or an accommodating through hole having a depth corresponding to a height of the electronic component, and allows the electronic component to be arranged in the accommodating recessed portion or the accommodating through hole.

The invention according to claim 4 is the laminated wiring board set forth in any one of claims 1 to 3, and is characterized in that two or more of the conductors continuous with each of the electrodes are provided in a straight line in a short-side direction that is perpendicular to a longitudinal direction of the electronic component.

The invention according to claim 5 is the laminated wiring board set forth in any one of claims 1 to 4, and is characterized in that two or more of the conductors continuous with each of the electrodes are provided at symmetrical positions about an axis in the longitudinal direction of the electronic component.

The invention according to claim 6 is the laminated wiring board set forth in claim 3, and is characterized in that the prepreg is made of a resin in which an epoxy resin is impregnated in a glass cloth or an aramid nonwoven fabric.

The invention according to claim 7 is the laminated wiring board set forth in claim 3 or 6, and is characterized in that the prepreg is made of a laminated body used by laminating a plurality of layers of the prepreg corresponding to the height of the electronic component.

The invention according to claim 8 is the laminated wiring board set forth in any one of claims 1 to 7, and is characterized in that the conductors are made of a cured conductive paste which contains at least one kind of metallic particle selected from among nickel, silver, and copper, and at least one kind of metallic particle selected from among tin, bismuth, indium, and lead.

A manufacturing method for a laminated wiring board according to claim 9 is characterized by including the steps of forming via holes in an insulating layer in which a conductor circuit is formed on one surface thereof and an adhesive layer is formed on an other surface thereof, such that two or more of the via holes are provided for each electrode at locations connected to the electrodes of the electronic component, the via holes passing through the adhesive layer and the insulating layer so that the conductor circuit is partially exposed therefrom, forming a first substrate in which two or more conductors continuous with each of the electrodes of the electronic component are formed by filling the respective via holes with a conductive paste, and sandwiching the electronic component and an embedding member embedding the electronic component therein between a second substrate and the first substrate having adhesive layers, respectively, so that the adhesive layers face each other, laminating the first substrate and the second substrate so that each of the electrodes is connected to two or more of the conductive paste, the conductive paste being formed in the first substrate, and then integrally joining the laminated body by thermal compression bonding.

The invention according to claim 10 is the manufacturing method for the laminated wiring board set forth in claim 9, and is characterized in that the step of laminating the first substrate and the second substrate includes the steps of preparing the embedding member including an insulating layer and an adhesive layer that are laminated and have an opening portion in which the electronic component is accommodated, and laminating the first substrate and the second substrate having the adhesive layers, respectively, so that the adhesive layers face each other and the electronic component is accommodated in the opening portion of the embedding member.

The invention according to claim 11 is the manufacturing method for the laminated wiring board set forth in claim 9 and is characterized in that the step of laminating the first substrate and the second substrate includes the steps of causing the first substrate to preliminarily retain the electronic component by connecting two or more of the conductive paste formed in the first substrate to each of the electrodes, forming the insulating embedding member in which an accommodating recessed portion or an accommodating through hole is formed with a depth corresponding to a height of the electronic component, bonding the embedding member to the first substrate after arranging the electronic component having the height corresponding to the accommodating recessed portion or the accommodating through hole, and laminating the first substrate and the second substrate having the adhesive layers, respectively, so that the adhesive layers face each other and sandwich the electronic component and the embedding member therebetween.

According to the laminated wiring board set forth in claim 1, since the electrodes of the electronic component are continuous with the conductor circuits formed on the first substrate, through two or more conductors per electrode, the number of connecting areas (conductors) between the electrodes of the electronic component and the conductor circuits is increased, thereby improving reliability of electrical connection between the electrodes of the electronic component and the conductor circuits connected thereto.

According to the manufacturing method for the laminated wiring board set forth in claim 9, since the via holes are formed in the via hole forming process so that there are two or more of the via holes per electrode at locations connected to the electrodes of the electronic component, two or more conductors are able to be formed for each of the electrodes of the electronic component by filling the conductive paste in the via holes, thereby inhibiting displacement of the electronic component.

BRIEF DESCRIPTION OF THE DRAWINGS

FIG. 2A is a plan view thereof, and FIG. 2B is a perspective view thereof;

FIG. 4A is a plan view thereof, and FIG. 4B is a perspective view thereof;

FIGS. 5A to 5E are sectional views of respective processes in a via hole forming process and a substrate forming process included in a manufacturing process for the laminated wiring board according to the first embodiment of the present invention;

FIGS. 6A to 6D are sectional views of respective processes in an IC chip forming process included in the manufacturing process for the laminated wiring board according to the first embodiment of the present invention;

DETAILED DESCRIPTION OF THE EMBODIMENT OF THE INVENTION

Next, specific embodiments to which the present invention is applied will be explained in detail with reference to the drawings.

First Embodiment

Configuration of Laminated Wiring Board

Figure 1:
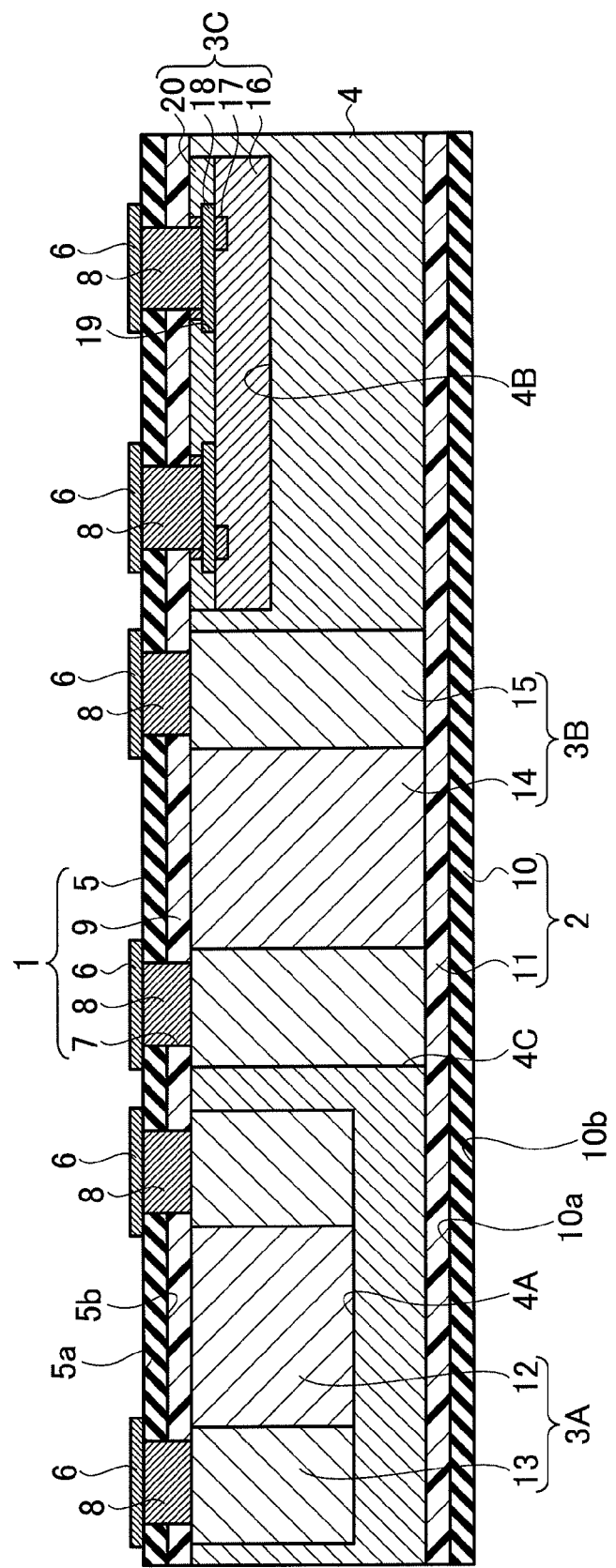
FIG. 1 is a sectional view of a laminated wiring board according to a first embodiment of the present invention.

First, a configuration of a laminated wiring board to which the present invention is applied will be explained with reference to FIG. 1. FIG. 1 is a sectional view of a laminated wiring board according to a first embodiment of the present invention. The laminated wiring board according to the first embodiment of the present invention includes mainly a first substrate 1, a second substrate 2, a plurality of electronic components 3 (3A, 3B, and 3C) having different heights and embedded between the first substrate 1 and the second substrate 2, and an insulating embedding member 4 in which the electronic components 3 are embedded. It is to be noted that the number of the electronic components 3 may be one, instead of more than one.

The first substrate 1 has an insulating layer 5 made of, for example, a polyimide resin film. On one surface 5a of the insulating layer 5, conductor circuits 6 made of copper foil are formed. On the other surface 5b of the insulating layer 5, via holes 7 are formed through the insulating layer 5, thus allowing the conductor circuits 6 (in actuality, land portions of the conductor circuits 6) to be partially exposed therefrom. Conductors 8, which are made of cured conductive paste, are formed in the via holes 7 by filling the via holes 7 with conductive paste which is then cured and alloyed by heat. On the other surface 5b of the insulating layer 5, an adhesive layer 9 is formed for retaining the electronic components 3 on the first substrate 1 preliminarily.

The second substrate 2 includes an insulating layer 10 made of, for example, a polyimide resin film, and an adhesive layer 11 formed on one surface 10a of the insulating layer 10.

In the second substrate 2 illustrated in FIG. 1, although the conductor circuits 6 formed on the first substrate 1 are not formed on the other surface 10b, the conductor circuits 6 used as wire circuits may be formed on the other surface 10b.

The first substrate 1 and the second substrate 2 are placed opposite to each other so that the adhesive layers 9 and 11 face an inner side. A distance between the first substrate 1 and the second substrate 2 facing each other is set to be a height of the highest electronic component 3B which is embedded between these substrates.

The electronic components 3 include a passive component such as a resistor and a capacitor, and an active component such as an IC, a diode, and a transistor. The concept of the electronic components 3 defined herein is that both passive component and active component are included therein. In the first embodiment of the present invention, a resistor 3A, a capacitor 3B, and an IC chip 3C having different heights were used as the electronic components. These electronic components 3, in ascending order of height, are the IC chip 3C, the resistor 3A, and the capacitor 3B.

In the resistor 3A, electrodes 13 provided on both sides of a resistor body 12 are connected to the conductors 8 of the first substrate 1. In the capacitor 3B, electrodes 15 provided on both sides of a capacitor body 14 are connected to the conductors 8 of the first substrate 1. The IC chip 3C is constructed by having electrode pads 17 formed on a surface of a wafer-like IC 16, conductor circuits 18 formed on the electrode pads 17, and an insulating layer 20 in which contact holes 19 are formed for the conductor circuits 18. In the IC chip 3C, the conductor circuits (in actuality land portions of the conductor circuits 18) 18 are connected to the conductors 8 of the first substrate 1. Further, the resistor 3A, the capacitor 3B, and the IC chip 3C are joined by the adhesive layer 9 of the first substrate 1.

In the first embodiment of the present invention in particular, the electrodes 13 of the resistor 3A that is a passive component, and the electrodes 15 of the capacitor 3B that is also a passive component are electrically continued and connected to the conductor circuits 6 through two or more of the conductors 8 per electrode. Specifically, the resistor 3A shown in FIGS. 2A and 2B will be explained as an example. Two of the conductors 8 and 8 formed in the first substrate per electrode are in contact with each of the electrodes 13 provided on both sides of the resistor body 12. Although not illustrated, two of the conductors 8 and 8 per electrode are also in contact with each of the electrodes 15 of the capacitor 3B. On the contrary, in the first embodiment of the present invention, one conductor 8 is in contact with each of the conductor circuits 18 of the IC chip 3C. It should be noted that two or more of the conductors 8 and 8 may be in contact with each of the conductor circuits 18 of the IC chip 3C where appropriate.

Two of the conductors 8 and 8 continuous with each electrode are provided in a straight line in a short-side direction (a direction indicated by arrow S in FIGS. 2A and 2B) which is perpendicular to a longitudinal direction (a direction indicated by arrow L in FIGS. 2A and 2B) of the resistor 3A. Also, two of the conductors 8 and 8 continuous with each electrode are provided in symmetric positions about an axis C (a line indicated by line C in FIGS. 2A and 2B) in the longitudinal direction of the resistor 3A.

Figure 3:
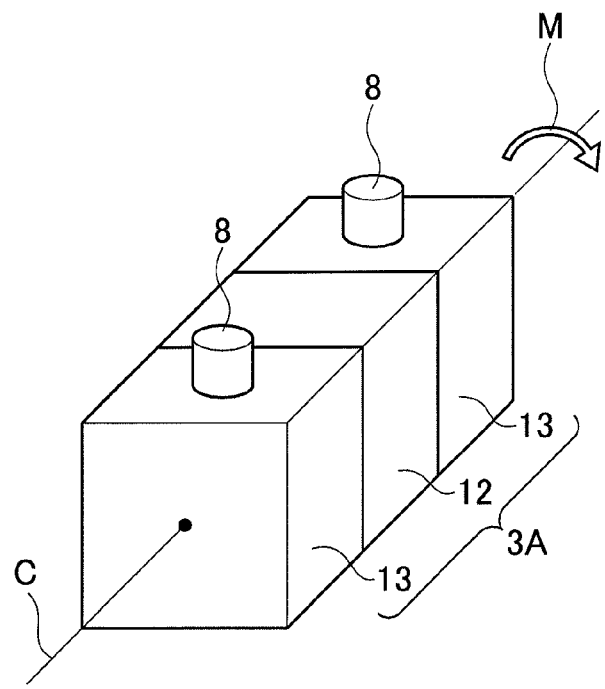
FIG. 3 shows a comparative example of the first embodiment of the present invention, and is a perspective view of an electronic component in which one conductor is provided in each electrode of the electronic component.

For example, as illustrated in FIG. 3, when only one conductor 8 is connected to each electrode, a force that tries to fix the resistor 3A to the first substrate 1 is weak with respect to a rotation moment M around the axis C in the longitudinal direction of the resistor 3A, and a preliminary retention position of the resistor 3A to the first substrate 1 is displaced easily. In a process of manufacturing the first substrate 1 (the manufacturing process will be described later), when the resistor 3A is preliminarily retained to the first substrate 1 by bringing the electrodes 13 into contact with conductive paste that is the conductors 8 before curing, the resistor 3A may be displaced with respect to the first substrate 1 as the moment M acts on the resistor 3A owing to an external force that acts on the resistor 3A when conveying the first substrate 1 or embedding the resistor 3A in the embedding member 4.

On the other hand, in the laminated wiring board according to the first embodiment of the present invention, since two of the conductors 8 are connected to each electrode, a retaining force that fixes the resistor 3A to the first substrate 1 is enhanced, and positioning accuracy is improved. Moreover, according to the first embodiment of the present invention, since more than one conductor 8 is connected to each electrode, reliability of electrical connection between the conductor circuit 6 and the electrodes 13 is improved.

The insulating embedding member 4 is prepreg that is cured by heat, and the prepreg being a semi-hardened sheet of epoxy resin impregnated glass cloth. The insulating embedding member 4 surrounds the electronic components 3 that are the resistor 3A, the capacitor 3B, and the IC chip 3C, thereby embedding these electronic components 3 between the first substrate 1 and the second substrate 2. In the insulating embedding member 4, accommodating recessed portions 4A and 4B and an accommodating through hole 4C are formed with depths corresponding to heights of the electronic components 3, respectively.

In an area of the insulating embedding member 4 corresponding to the lowest IC chip 3C, the accommodating recessed portion 4B is formed with a depth equivalent to the height of the IC chip 3C and corresponding to an external shape of the IC chip 3C. In an area of the insulating embedding member 4 corresponding to the resistor 3A having an intermediate height, which is higher than the IC chip 3C and lower than the capacitor 3B, the accommodating recessed portion 4A is formed with a depth equivalent to the height of the resistor 3A and corresponding to an external shape of the resistor 3A. Also, in an area of the insulating embedding member 4 corresponding to the highest capacitor 3B, the accommodating through hole 4C is formed with a depth equivalent to the height of the capacitor 3B and corresponding to an external shape of the capacitor 3B.

The insulating embedding member 4 is made of a laminated structure in which a plurality of layers of the prepreg is laminated in accordance with the heights of the electronic components 3. The plurality of layers of the prepreg becomes a single layer through thermo compression bonding by which boundaries between the layers disappear. As the height of the electronic component 3 increases, more layers of the prepreg are laminated accordingly in parallel with the height of the electronic component 3. In the first embodiment of the present invention, three layers of the prepreg are laminated.

According to the laminated wiring board configured as above, since each of the electrodes of the electronic components is continuous with the conductor circuit formed on the first substrate through two or more conductors per electrode, the number of connecting areas (conductors) between the electrodes of the electronic components and the conductor circuit is increased, thereby improving reliability of electrical connection between the electrodes of the electronic components and the conductor circuit connected thereto.

Figure 2A:
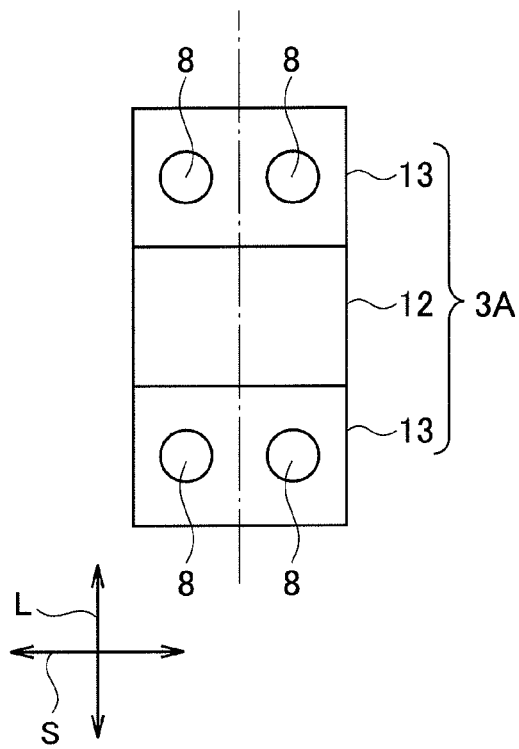
FIGS. 2A and 2B show an example in which two of the conductors are provided in each electrode of an electronic component included in the laminated wiring board according to the first embodiment of the present invention, where
Figure 2B:
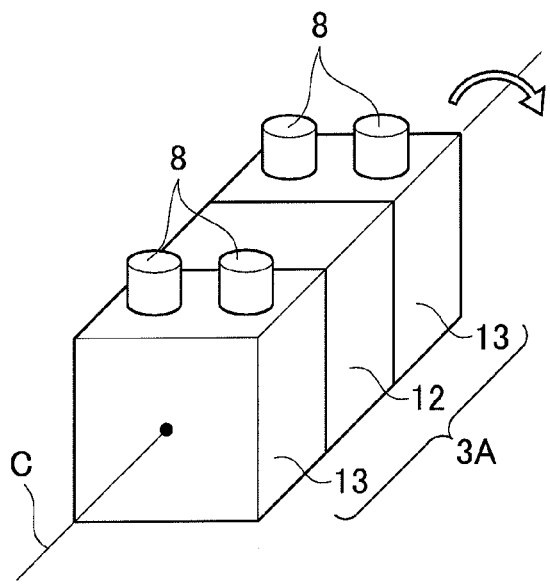

An example of the laminated wiring board according to the first embodiment of the present invention has been described with reference to FIGS. 1, 2A and 2B, but the present invention is not limited to the foregoing embodiment and various changes may be made therein.

Figure 4A:
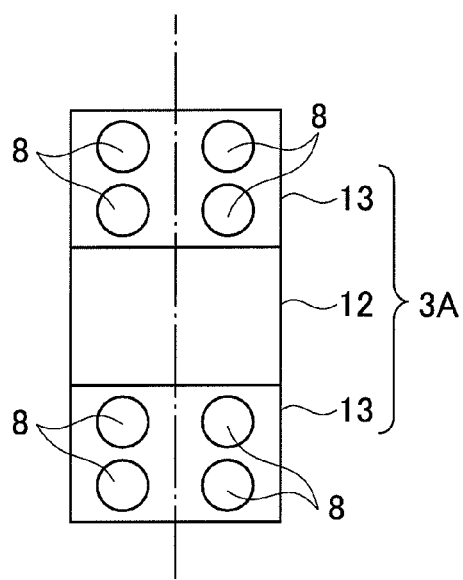
FIGS. 4A and 4B show an example in which four conductors are provided in each electrode of the electronic component included in the laminated wiring board according to the first embodiment of the present invention, where
Figure 4B:
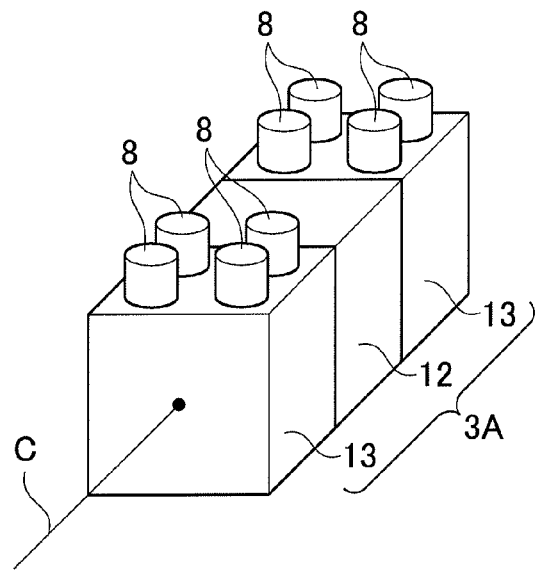

For example, as illustrated in FIGS. 4A and 4B, the number of the conductors 8 continuous with each of the electrodes 13 is two or more, and is four in the drawings. Four of the conductors 8 provided per electrode of the resistor 3A are arranged in a straight line in the short-side direction perpendicular to the longitudinal direction of the resistor 3A and positioned symmetrically about the axis C in the longitudinal direction. When four of the conductors 8 are provided per electrode, the number of the conductors 8 is increased, and it is thus more difficult for the resistor 3A to be displaced with respect to the first substrate 1, and, moreover, reliability of electrical connection to the conductor circuits 6 on the first substrate 1 is enhanced.

<Manufacturing Method for Laminated Wiring Board>

Figure 7:
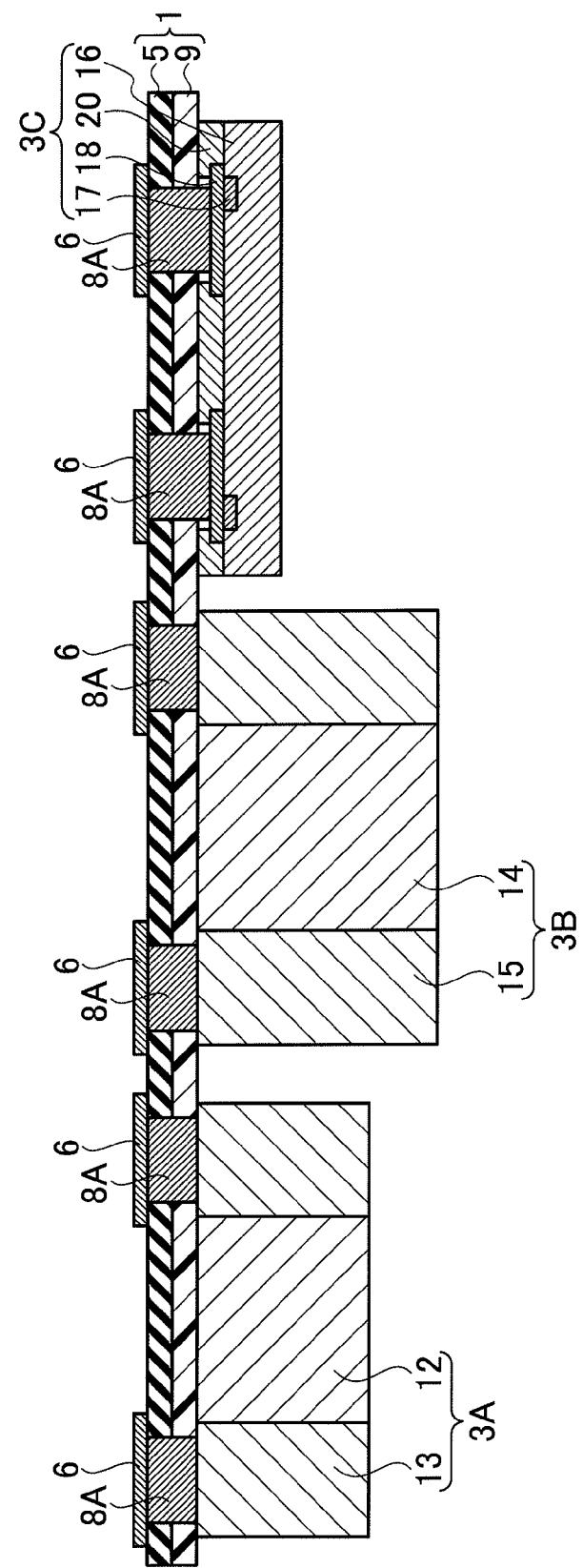
FIG. 7 is a sectional view showing a preliminary retention process included in the manufacturing process for the laminated wiring board according to the first embodiment of the present invention.
Figure 8A:
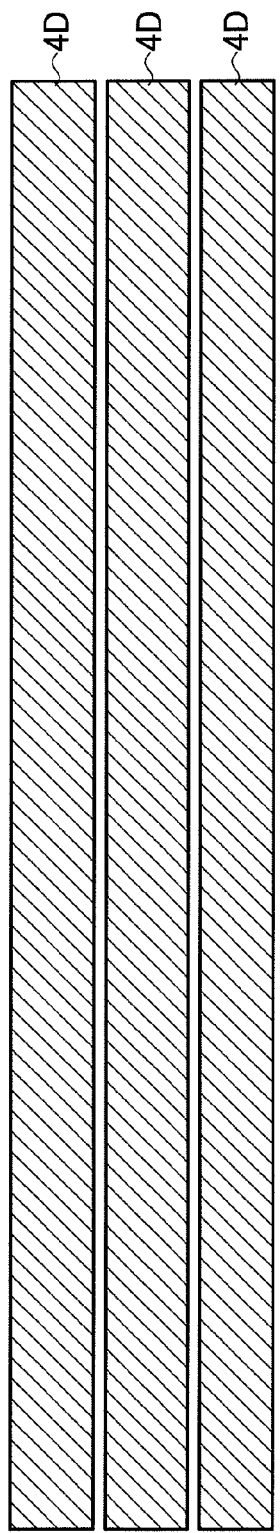
FIGS. 8A and 8B are sectional views of respective processes in an embedding member forming process included in the manufacturing process for the laminated wiring board according to the first embodiment of the present invention.
Figure 8B:
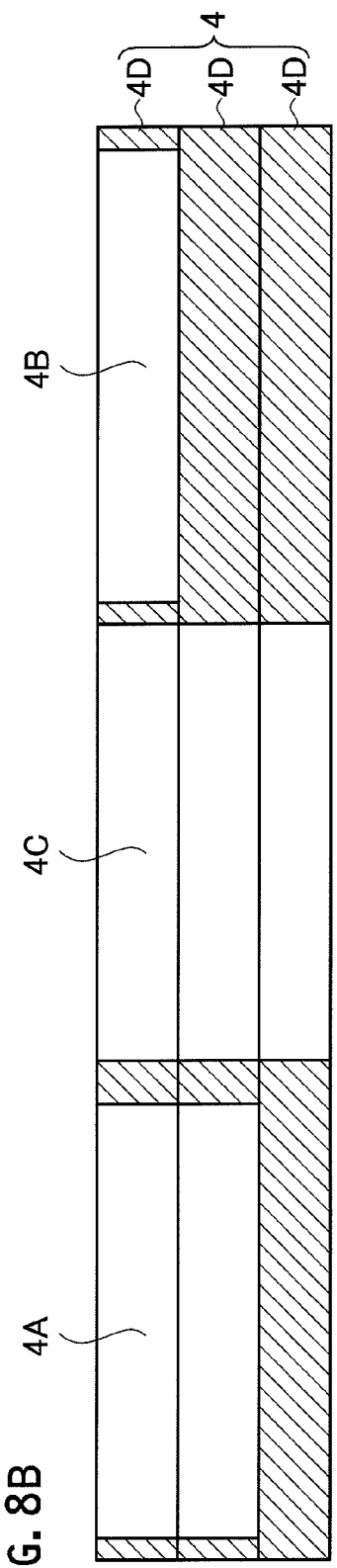
Figure 9:
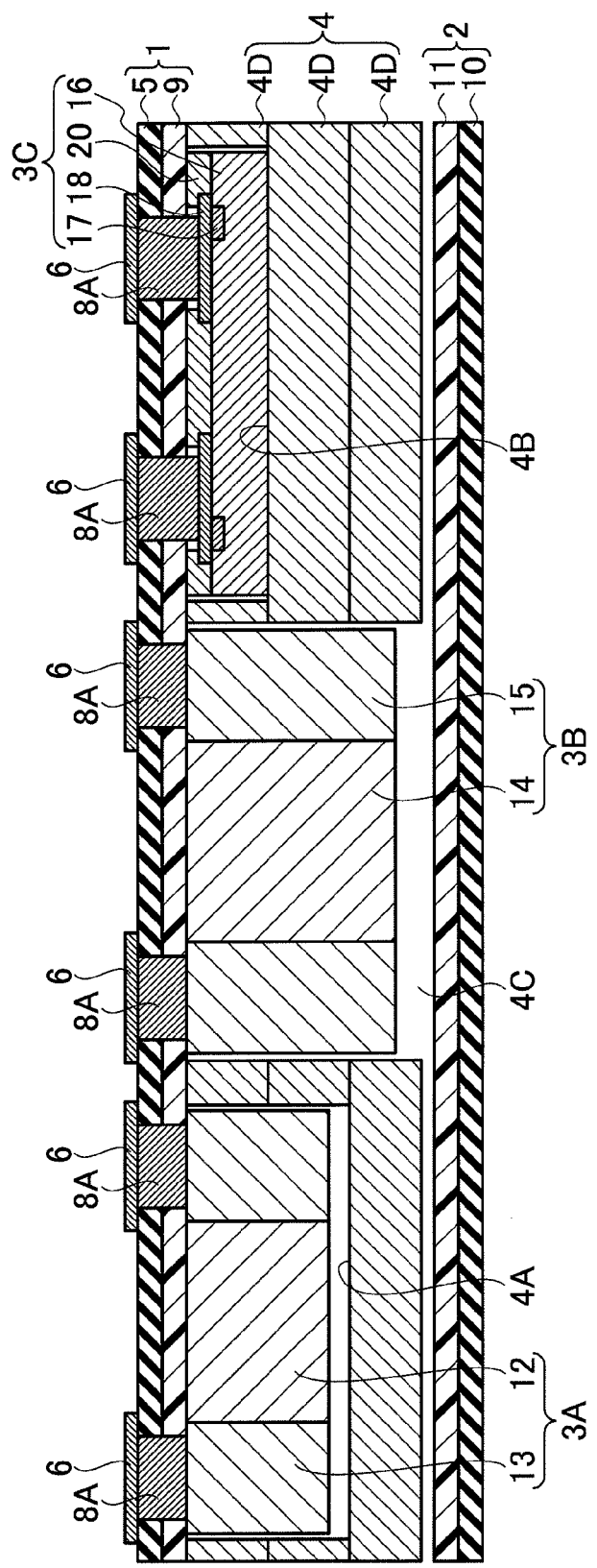
FIG. 9 is a sectional view of a bonding process included in the manufacturing process for the laminated wiring board according to the first embodiment of the present invention.

Next, a manufacturing method for the above-described laminated wiring board will be explained with reference to FIGS. 5A through 9. FIGS. 5A to 5E show a via hole forming process and a substrate forming process, FIGS. 6A to 6D show an IC chip forming process, FIG. 7 shows a preliminary retention process, FIGS. 8A and 8B show an embedding member forming process, and FIG. 9 shows a bonding process.

First, the substrate forming process for forming the first substrate 1 and the second substrate 2 is conducted. In a process shown in FIG. 5A, a copper clad laminate (CCL) is prepared, in which a wiring material layer 6A made of copper foil is provided on one surface (upper face) of the flexible insulating layer 5 that is made of, for example, a polyimide resin film. For the insulating layer 5 and the wiring material layer 6A, those having the thicknesses of 20 µm (polyimide resin film) and 12 µm (copper foil) were used, respectively.

Also, the CCL may be fabricated by using a so-called casting method in which polyimide varnish is applied on copper foil and the varnish is cured, or by spattering a plating seed layer on a polyimide film and growing electrolytic copper plating, or the CCL made by bonding rolled copper foil or electrolytic copper foil and a polyimide film together may be used. For the insulating layer 5, a plastic film such as liquid crystal polymer may be used instead of polyimide resin.

In a process shown in FIG. 5B, an etching resist pattern (etching mask) corresponding to a desired circuit pattern is formed by photolithography on a surface of the wiring material layer 6A, and then chemical selective etching is performed on the wiring material layer 6A, thereby forming the conductor circuits 6 patterned into the desired circuits. For the etching, an etchant containing, for example, ferric chloride as a principal component thereof is used, but an etchant containing cupric chloride as a principal component thereof may also be used.

In a process shown in FIG. 5C, on the other surface (lower face) of the insulating layer 5 on the opposite side of the conductor circuits 6, the adhesive layer 9 and a resin film F are laminated in this order and bonded together by thermo compression bonding. For the adhesive layer 9, an epoxy-based thermosetting resin film adhesive having a material thickness of 25 µm was used. Also, for the resin film F, a polyimide resin film having a thickness of 25 µm was used. For the thermo compression bonding, a vacuum laminator was used and the adhesive layer 9 and the resin film F were pressed by a pressure of 0.3 MPa in an atmosphere under reduced pressure at a curing temperature of the above-mentioned adhesive or lower.

As a material of the adhesive layer 9, an adhesive such as acrylic resin instead of the foregoing epoxy-based thermosetting resin, or a thermoplastic adhesive typified by thermoplastic polyimide may be used. Further, the adhesive layer 9 may be formed by applying, for example, a varnish-like resin adhesive instead of the film-like material on the lower surface of the insulating layer 5.

For the resin film F, instead of polyimide, a plastic film such as PET (polyethylene terephthalate) and PEN (polyethylene naphthalate) may be used, and a film which can be adhered and peeled by UV radiation may be adherently formed on a surface of the adhesive layer 9.

Next, in the via hole forming process shown in FIG. 5D, the plurality of via holes 7 (two in each of six locations in the drawing) with a diameter of 100 µm are formed by perforating the insulating layer 5, the adhesive layer 9, and the resin film F from a lower face side by using a YAG laser. The via holes 7 are formed so that there are two (or more than two) via holes 7 provided in each of the electrodes of the electronic component. Thereafter, in order to remove smear that is generated during the perforation process, a plasma desmear process is conducted using a $CF_4$ and $O_2$ mixed gas.

The via holes 7 may be formed by laser processing using a carbon dioxide laser or an excimer laser, or by a drill process or chemical etching.

Moreover, a kind of gas used for the plasma desmear process explained above is not limited to the $CF_4$ and $O_2$ mixed gas, and other inert gas such as Ar may be used, and wet desmear process using a drug solution may be applied instead of a dry process.

Then, in a process shown in FIG. 5E, the conductive paste 8A is filled in the via holes 7 by screen printing until respective spaces are completely filled. The conductive paste 8A is made of a paste which contains at least one kind of metallic particle with low electrical resistance selected from among nickel, silver, and copper, and at least one kind of metallic particle with low melting point selected from among tin, bismuth, indium, and lead, and is mixed with a binder component which contains epoxy resin as a chief component. For the conductive paste 8A, a metallic composition is used that is easily alloyed as the above-mentioned metallic particles are able to be diffusion-bonded to each other and diffusion-bonded to the electronic components 3 at a temperature as low as a curing temperature of the adhesive layer 9, thereby ensuring connection reliability equivalent to that of bulk metal or connection between layers by plating. Note that, since the conductive paste 8A also has excellent thermal conductivity, an effect may be obtained in which generated heat is conducted and radiated to outside.

Thereafter, the resin film F is peeled off. As a result, distal end portions (lower faces) of the print-filled conductive paste 8A are exposed with a height equivalent to a thickness dimension of the peeled resin film F, while projecting from the lower face side of the adhesive layer 9. As explained above, by selecting a thickness of the resin film F as appropriate, the height of projections of the conductive paste 8A which later becomes the conductors 8 are adjusted. Through these processes described above, the first substrate 1 having two or more of the conductive paste 8A per electrode of the electronic components is formed.

Similarly to the first substrate 1, the second substrate 2 is manufactured by forming an adhesive layer 11 on one surface 10a of the flexible insulating layer 10 made of a polyimide resin film. For the adhesive layer 11 used here is the same as the adhesive layer 9 included in the first substrate 1. Note that process drawing of a manufacturing process for the second substrate 2 is omitted because the process is simple.

Next, a manufacturing process for the IC chip 3C will be explained with reference to FIGS. 6A to 6D. In a process shown in FIG. 6A, a wafer-like IC 16A before dicing is prepared, which is formed of an inorganic insulating film of silicon oxide or silicon nitride. Then, in a process shown in FIG. 6B, on a surface of the wafer-like IC 16A, the conductor circuits 18 patterned by, for example, a copper plating layer are formed on electrode pads 17 and the inorganic insulating film of the IC by using a semi additive process.

Thereafter, in the process shown in FIG. 6C, a liquid photosensitive polyimide precursor, for example, is spin-coated on the entire surface of the wafer-like IC 16A, and then the contact holes 19 are formed by photolithography, followed by baking, thereby forming the insulating layer 20. Finally, in the process shown in FIG. 6D, after testing is conducted by probing and a thickness of the wafer is reduced by grinding a back surface of the wafer-like IC 16A, the wafer-like IC 16A is diced and the plurality of IC chips 3C are thus obtained.

When forming the insulating layer 20, such as benzocyclobutene (BCB) or polybenzoxazole (PBO) may be used as other photosensitive resin material. Further, the photosensitive resin does not necessarily have to be applied by spin coating, and curtain coat, screen printing, spray coat, or the like may be used. Moreover, the photosensitive resin is not limited to a liquid form, and a film-like resin may be laminated on the wafer-like IC 16A. In a circuit of the IC chip 3C formed in this way, functions of an inductor, a capacitor, a resistor, and so on may be added besides a normal conductor circuit.

Next, the preliminary retention process in which the electronic components 3 are retained preliminarily by each of the conductive paste 8A formed in the first substrate 1 will be explained with reference to FIG. 7. The resistor 3A, the capacitor 3B, and the IC chip 3C are aligned by a semiconductor chip mounting machine, and the electrodes 13 of the resistor 3A, the electrodes 15 of the capacitor 3B, and the land portions of the conductor circuits 18 of the IC chip 3C are placed into contact with the conductive paste 8A of the first substrate 1, respectively.

At this time, two of the conductive paste 8A are in contact with each of the electrodes 13 of the resistor 3A. Similarly, two of the conductive paste 8A are in contact with each of the electrodes 15 of the capacitor 3B. On the contrary, one of the conductive paste 8A is in contact with each of the conductor circuits 18 which serve as electrodes of the IC chip 3C. Then, by conducting thermo compression bonding at a temperature equivalent to or lower than a curing temperature of the material of the insulating layer 9 and the conductive paste 8A, the resistor 3A, the capacitor 3B, and the IC chip 3C are preliminarily retained to the first substrate 1. At this time, since the resistor 3A and the capacitor 3B are retained by two of the conductive paste 8A per electrode thereof, respectively, it becomes difficult for the resistor 3A and the capacitor 3B to be displaced with respect to the first substrate 1, and reliability of electrical connection is also enhanced.

Next, the embedding member forming process in which the insulating embedding member 4 is formed will be explained with reference to FIGS. 8A and 8B. First of all, in the process shown in FIG. 8A, a semi-hardened sheet of epoxy resin impregnated glass cloth, that is so-called prepreg 4D, is prepared. In the first embodiment of the present invention, three layers of the prepreg 4D are laminated on top of each other so as to be as high as the capacitor 3B that is the highest electronic component 3 embedded between the first substrate 1 and the second substrate 2. For example, when the height of the capacitor 3B is 300 mm, a laminated body of three layers of 100 mm-thick prepreg 4D is used.

Next, in the process shown in FIG. 8B, the accommodating recessed portions 4A and 4B corresponding to the heights of the resistor 3A and the IC chip 3C, respectively, and the accommodating through hole 4C corresponding to the height of the capacitor 3B are formed in the laminated body in which three layers of the prepreg 4D are stacked on each other. At a location corresponding to the resistor 3A, the accommodating recessed portion 4A is formed with a size and a depth which allow the resistor 3A to be disposed (fitted and arranged) therein. At a location corresponding to the IC chip 3C, the accommodating recessed portion 4B is formed with a size and a depth which allow the IC chip 3C to be disposed (fitted and arranged) therein. At a location corresponding to the capacitor 3B, the accommodating through hole 4C is formed with a size that allows the capacitor 3B to be disposed (fitted and arranged) therein.

For the insulating embedding member 4, an aramid nonwoven fabric may be used instead of a glass cloth, or a material containing no fibrous material may be used as well. The accommodating recessed portions 4A and 4B and the accommodating through hole 4C may be processed by laser or a drill.

Next, the bonding process in which the insulating embedding member 4 is bonded to the first substrate 1 will be explained with reference to FIG. 9. The insulating embedding member 4 is bonded to the first substrate 1 so that the resistor 3A, the IC chip 3C, and the capacitor 3B are respectively deposited (fitted and arranged) within the accommodating recessed portions 4A and 4B, and the accommodating through hole 4C which are formed in the laminated body of the three layers of the prepreg 4D.

Next, a laminating process will be explained with reference to FIG. 9, in which the first substrate 1, the insulating embedding member 4, and the second substrate 2 are integrally joined to one another through thermo compression bonding. First, the second substrate 2 is laminated by using the adhesive layer 11 thereof as a bonding surface so as to sandwich the insulating embedding member 4 with the first substrate 1. Then, thermo compression bonding is conducted in a lamination direction on a laminated body made of the resistor 3A, the capacitor 3B, and the IC chip 3C embedded by the insulating embedding member 4 between the first substrate 1 and the second substrate 2, in an atmosphere under reduced pressure of 1 kPa or lower using a vacuum cure press machine, thereby completing the laminated wiring board shown in FIG. 1.

Once thermo compression bonding is performed on the laminated body as described above, the laminated three layers of the prepreg 4D are closely adhered to surrounding areas of the resistor 3A, the capacitor 3B, and the IC chip 3C by heat, and are also closely adhered to each other and interfaces therebetween disappear, thus creating the single layer of the insulating embedding member 4. Further, the conductive paste 8A formed in the first substrate 1 is cured and alloyed at the same time, thus becoming the conductors 8. Moreover, the adhesive layers 9 and 11 formed on the first substrate 1 and the second substrate 2, respectively, flow plastically by heat and cooled, thereby enhancing bonding strength of the laminated body. Through the foregoing processes, the laminated wiring board illustrated in FIG. 1 is obtained.

According to the first embodiment of the present invention, since the via holes are formed so that there are two of the via holes per electrode at positions connected to the electrodes of the electronic components, and the conductive paste is filled in the via holes, the electronic components are able to be preliminarily retained to the first substrate via two or more of the conductive paste per electrode of the electronic components, thereby improving a force for retaining the electronic components and reliability of electrical connection with the conductor circuits formed on the first substrate.

Further, according to the first embodiment of the present invention, since a retention force which fixes the electronic components to the first substrate is reinforced by the plurality of the conductive paste as two of the conductive paste are connected to each of the electrodes, the electronic components are positioned more accurately with respect to the first substrate, and it becomes difficult for the electronic components to rotate due to an external force.

Also, according to the first embodiment of the present invention, since two or more of the conductive paste continuous with each of the electrodes are provided in a straight line in the short-side direction which is perpendicular to the longitudinal direction of the electronic component, even when a rotation moment acts on the electronic component about the axis in the longitudinal direction thereof, a drag against a force of the rotation moment is enhanced because two of the conductive paste lie in the straight line in the short-side direction, thereby making it even more difficult for the electronic component to rotate.

Further, according to the first embodiment of the present invention, since two or more of the conductive paste continuous with each of the electrodes are provided at symmetric positions about the axis of the electronic component in the longitudinal direction, drags against forces of the rotation moment in clockwise and anticlockwise directions become equal to each other in both of the directions, and displacement of the electronic component to the first substrate 1 is inhibited even more.

Moreover, according to the first embodiment of the present invention, the electronic components having different heights from each other are preliminarily retained by the conductive paste that is electrically connected to the conductor circuits formed on the first substrate, and then the second substrate is laminated so as to sandwich the insulating embedding member in which the accommodating recessed portions and the accommodating through hole are formed therein with depths corresponding to the heights of the electronic components, respectively, and thermo compression bonding is performed on the laminated body thus forming the laminated wiring board, so a plating process is not required unlike a conventional build-up method, and production time is thus remarkably curtailed.

In a conventional process, since electronic components are first implemented on a rigid substrate and then embedded between both substrates, complicated processes such as printing of a counter paste or filling of underfill are needed beforehand, and, in processes after various components are embedded, forming of through holes using a drill, a plating process, a circuit forming process are also required, which might reduce a yield. However, in the first embodiment of the present invention, it is possible to omit the plating process and so on after the electronic components are embedded, thereby simplifying the manufacturing process and improving the yield.

Second Embodiment

In the first embodiment of the present invention, the case was explained where the electronic components were embedded by the prepreg that is used as the embedding member, but, in a second embodiment of the present invention, a case will be explained where an electronic component is embedded by using an embedding member having a laminated structure of an insulating layer and an adhesive layer.

<Configuration of Laminated Wiring Board>

Figure 10:
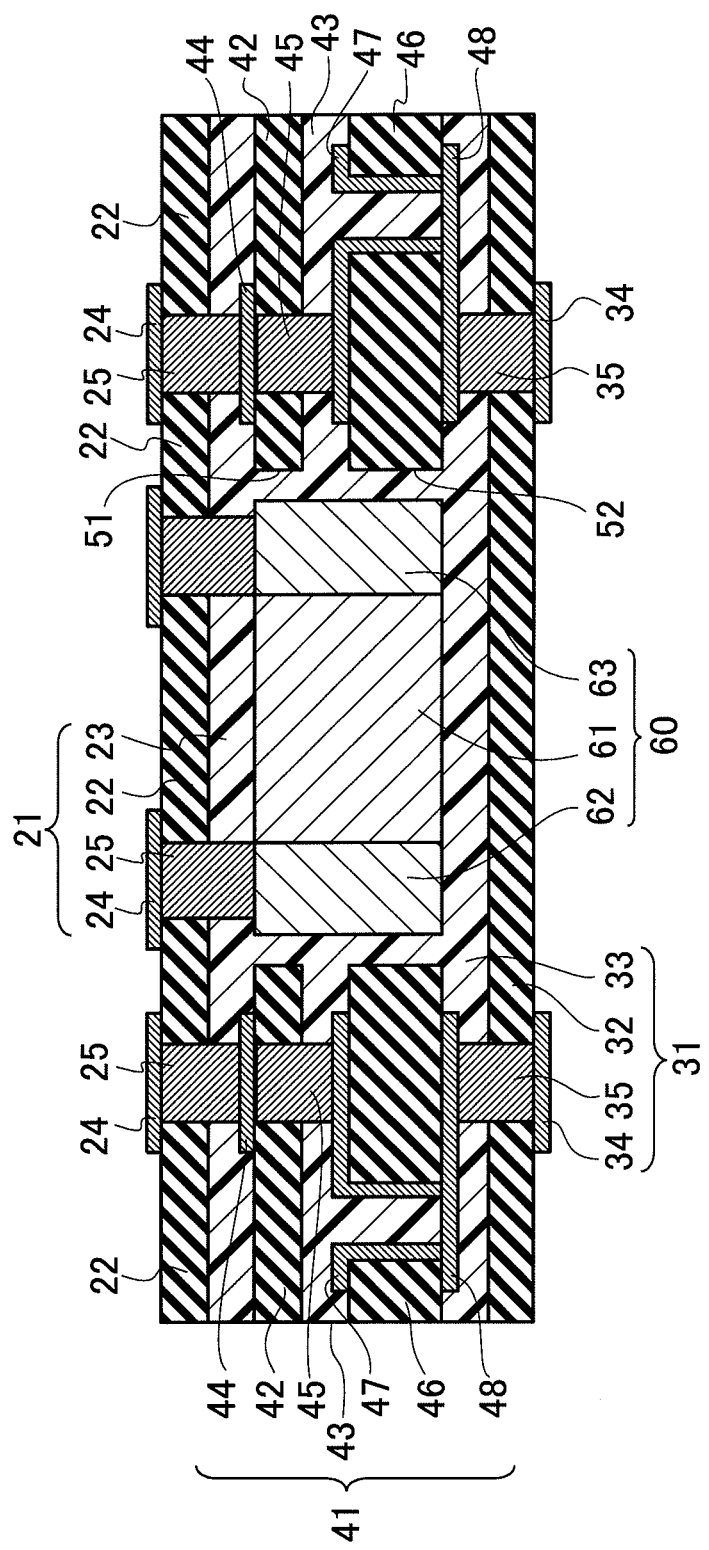
FIG. 10 is a sectional view of a laminated wiring board according to a second embodiment of the present invention.

As illustrated in FIG. 10, a laminated wiring board according to the second embodiment of the present invention includes a first substrate 21, a second substrate 31, an electronic component 60 embedded between the first substrate 21 and the second substrate 31, an embedding member 41 in which the electronic component 60 is embedded.

In the first substrate 21, conductor circuits 24 are formed on an upper face of an insulating layer 22, and an adhesive layer 23 is formed on a lower face of the insulating layer 22. Conductors (vias) 25 are respectively formed in a plurality of via holes which go through the insulating layer 22 and the adhesive layer 23 so that the conductor circuits 24 are partially exposed therefrom.

The electronic component 60 may be a passive component such as a capacitor and a resistor, or an active component such as an IC, and has a thickness of approximately 150 μm. The electronic component 60 has a body 61, and electrodes 62 and 63 arranged on both sides of the body 61. The electrodes 62 and 63 are connected to the conductors 25, respectively, so that the electronic component 60 is electrically connected to the conductor circuits 24. The electrodes 62 and 63 of the electronic component 60 are continuous with the conductor circuits 24 through two or more of the conductors 25 per electrode 62 or 63.

The second substrate 31 has an adhesive layer 33 which is laminated so as to face the adhesive layer 23 of the first substrate 21 and sandwich the electronic component 60 and the embedding member 41, an insulating layer 32 arranged on a lower face of the adhesive layer 33, conductor circuits 34 arranged on a lower face of the insulating layer 32, and conductors 35 which are respectively formed in a plurality of via holes which go through the insulating layer 32 and the adhesive layer 33 so that the conductor circuits 34 are partially exposed therefrom.

The embedding member 41 is arranged around the electronic component 60 so that the electronic component 60 is embedded therein. The embedding member 41 is a laminated structure including insulating layers 42 and 46 having opening portions 51 and 52, respectively, in which the electronic component 60 is accommodated, and an adhesive layer 43 arranged between the insulating layers 42 and 46. Conductor circuits 44 connected to the conductors 25 are arranged on an upper face of the insulating layer 42. Conductors 45 are respectively formed in a plurality of via holes which go through the insulating layer 42 and the adhesive layer 43 so that the conductor circuits 44 are partially exposed therefrom. Meanwhile, conductor circuits 48 electrically connected to the conductors 35 are arranged on a lower face of the insulating layer 46. Conductor circuits (plated vias) 47 connected to the conductors 45 are arranged in the plurality of via holes and also on an upper face of the insulating layer 46, the via holes going through the insulating layer 46 so that the conductor circuits 48 are partially exposed therefrom.

For the insulating layers 22, 32, 42, and 46, a polyimide resin film or the like may be used. The insulating layers 22, 32, and 42 have a thickness of between approximately 20 and 25 μm, and the insulating layer 46 has a thickness of approximately 50 μm. For the adhesive layers 23, 33, and 43, an epoxy-based thermosetting resin or the like may be used, and the adhesive layers 23, 33, and 43 have a thickness of approximately 25 μm. As a material of the conductor circuits 24, 34, 44, 47, and 48, copper (Cu) or the like may be used. The conductors 25, 35, and 45 may be made by using a conductive paste which contains at least one kind of metallic particle with low electrical resistance selected from among nickel, silver, and copper, and at least one kind of metallic particle with low melting point selected from among tin, bismuth, indium, and lead, and is mixed with a binder component that contains epoxy resin as a chief component.

Similarly to the first embodiment of the present invention, according to the laminated wiring board according to the second embodiment of the present invention, since each of the electrodes 62 and 63 of the electronic component 60 is continuous with the conductor circuit 24 formed on the first substrate 21 through two or more of the conductors 25 per electrode 62 or 63, the number of connecting areas (conductors) between the electrodes 62 and 63 of the electronic component 60 and the conductor circuits 24 is increased, thereby improving reliability of electrical connection between the electrodes 62 and 63 of the electronic component 60 and the conductor circuits 24 connected thereto.

Although FIG. 10 illustrates one electronic component 60, the number of electronic components embedded is not particularly limited, and a plurality of same kind or different kinds of electronic components may be provided. The plurality of electronic components may have the same height or different heights.

Further, the embedding member 41 arranged between the first substrate 21 and the second substrate 31 may have a laminated structure in which more numbers of the insulating layers and adhesive layers are laminated in accordance with the heights of the electronic component embedded therein.

<Manufacturing Method for Laminated Wiring Board>

Next, an example of a manufacturing method for the laminated wiring board according to the second embodiment of the present invention will be explained with reference to FIG. 11.

Figure 11:
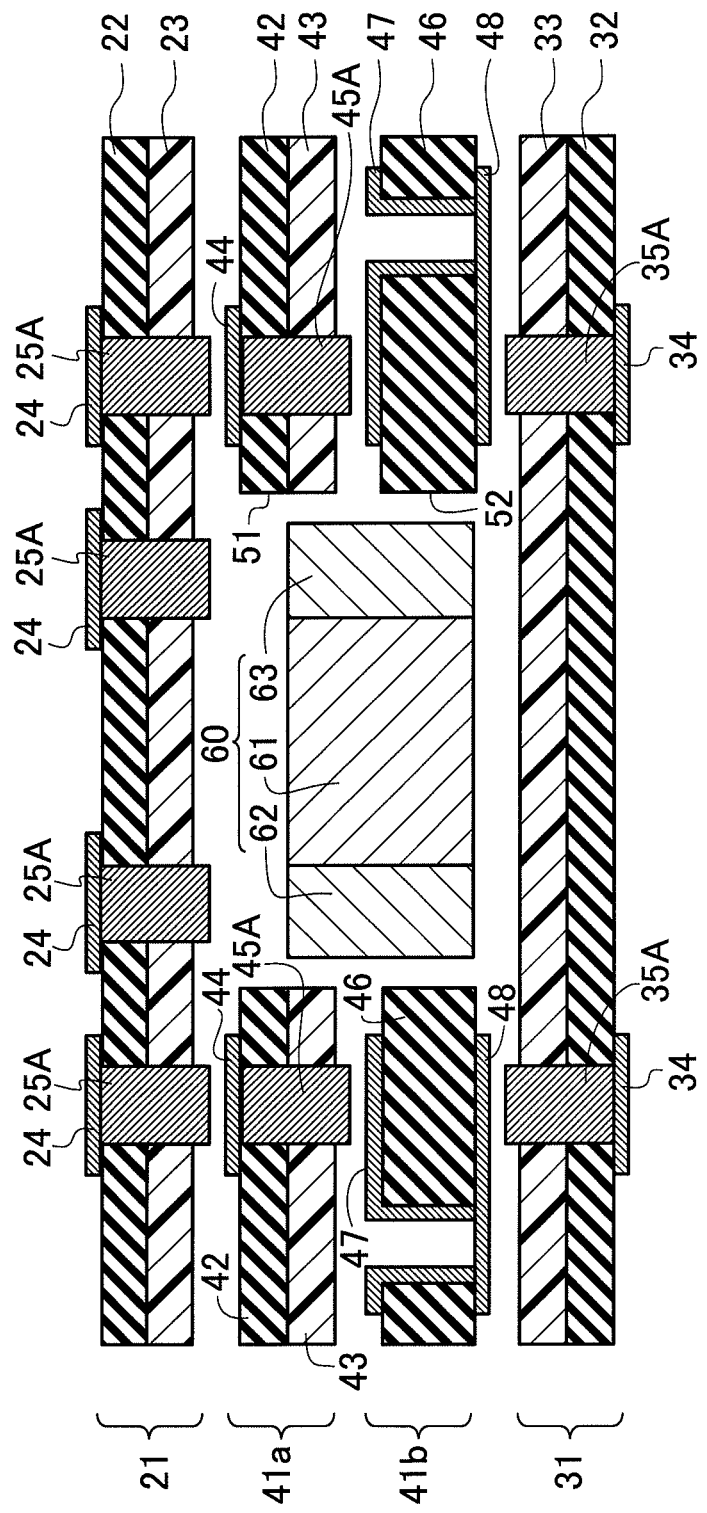
FIG. 11 is a sectional view for explaining a manufacturing process for the laminated wiring board according to the second embodiment of the present invention.

As illustrated in FIG. 11, the electronic component 60, and base materials 21, 31, 41a, and 41b are prepared. The base material (first substrate) 21 includes the insulating layer 22, the adhesive layer 23 arranged on the lower face of the insulating layer 22, the conductor circuits 24 arranged on the upper face of the insulating layer 22, and a conductive paste 25A which is filled in the via holes passing through the insulating layer 22 and the adhesive layer 23 and is electrically connected to the conductor circuits 24. The base material (second substrate) 31 includes the insulating layer 32, the adhesive layer 33 arranged on the upper face of the insulating layer 32, the conductor circuits 34 arranged on the lower face of the insulating layer 32, and a conductive paste 35A which is filled in the via holes passing through the insulating layer 32 and the adhesive layer 33 and is electrically connected to the conductor circuits 34. It is possible to form the base materials 21 and 31 similarly to the process of forming the first substrate 1 illustrated in FIGS. 5A to 5E.

The base material (first embedding member) 41a includes the insulating layer 42, the adhesive layer 43 arranged on the lower face of the insulating layer 42, the conductor circuits 44 arranged on the upper face of the insulating layer 42, and a conductive paste 45A which is filled in the via holes passing through the insulating layer 42 and the adhesive layer 43 and is electrically connected to the conductor circuits 44. A process of forming the base material 41a is almost the same as the process of forming the first substrate 1 shown in FIGS. 5A to 5E, except that an opening portion 51 for accommodating the electronic component 60 therein is provided by laser processing, etching or the like.

The base material (second embedding member) 41b is a double-sided board including the insulating layer 46, the conductor circuits 47 arranged on the upper face of the insulating layer 46 and in the via holes passing through the insulating layer 46, and the conductor circuits 48 arranged on the lower face of the insulating layer 46. For example, the conductor circuits 48 are formed by patterning copper foil by etching or the like, the copper foil being laminated on the lower face of the insulating layer 46, the opening portion 52 and the via holes are provided by laser processing, etching, or the like, and conductor circuits (vias) 47 are formed in the via holes and on the upper face of the insulating layer 46 by plating or the like, thereby forming the base material 41b.

Then, as shown in FIG. 11, the electronic component 60 is arranged so as to be accommodated in the opening portions 51 and 52 of the base materials 41a and 41b, and the base materials 21, 41a, 41b and 31 are laminated all at once. By performing thermo compression bonding on the laminated body in a lamination direction by using a vacuum cure press machine in an atmosphere under reduced pressure, the laminated wiring board illustrated in FIG. 10 is completed. The adhesive layers 23, 43, and 33 of the base materials 21, 41a, and 31, respectively depicted in FIG. 11 are closely adhered to surrounding areas of the electronic component 60 without any clearance due to the thermo compression bonding, and also adhered to each other so that interfaces therebetween disappear. Once the conductive paste 25A, 35A, and 45A is cured, the conductive paste 25A, 35A, and 45A is alloyed at the same time and becomes the conductors 25, 35, and 45, respectively.

According to the manufacturing method for the laminated wiring board according to the second embodiment of the present invention, even when the embedding member 41 having a laminated structure of the insulating layers 42 and 46 and the adhesive layer 43 is used, the via holes are formed in the via hole forming process so that there are two or more of the via holes formed for each of the electrodes 62 and 63 at locations connected to the electrodes 62 and 63 of the electronic component 60 similarly to the first embodiment of the present invention, so two or more of the conductors 25 are able to be formed for each of the electrodes 62 and 63 of the electronic component 60 by filling the via holes with the conductive paste 25A, thereby inhibiting displacement of the electronic component 60.

Although FIG. 11 illustrates the case where the base materials 21, 41a, 41b, and 31 are laminated all at once, the electronic component 60 may be preliminarily retained to the base material 21, and then the base materials 21, 41a, 41b, and 31 may be laminated, similarly to the first embodiment of the present invention. In such a case, the via holes are formed so that there are two or more of the via holes for each of the electrodes 62 and 63 at locations connected to the electrodes 62 and 63 of the electronic component 60, and the conductive paste 25A is filled in the via holes, so the electronic component 60 is able to be preliminarily retained by the base material 21 through two or more of the conductive paste 25A for each of the electrodes 62 and 63 of the electronic component 60. Hence, a force for retaining the electronic component 60 and reliability of electrical connection between the electronic component 60 and the conductor circuits 24 formed on the base material 21 are enhanced.

Furthermore, when the height of the electronic component 60 is increased, the number of layers of base materials having the same configuration as the base material 41a shown in FIG. 11 is increased according to the increased height, and the layers of the base materials are inserted between the base material 21 and the base material 41a, thus enabling to manufacture a laminated wiring board corresponding to the height of the electronic component 60.

INDUSTRIAL APPLICABILITY

The present invention is able to be applied to a technology which allows electrodes of an electronic component to be electrically connected to a conductor circuit formed on a substrate through a conductive paste.

What is claimed is:

1. A laminated wiring board, comprising:
a first substrate in which a conductor circuit is formed on one surface of an insulating layer and an adhesive layer is formed on an other surface of the insulating layer, and conductors are respectively formed in a plurality of via holes that pass through the insulating layer and the adhesive layer so that the conductor circuit is partially exposed therefrom;
an electronic component electrically connected to the conductor circuit by allowing electrodes of the electronic component to be connected to the conductors, respectively;
an embedding member arranged around the electronic components so that the electronic component is embedded therein; and
a second substrate having an adhesive layer laminated so as to face the adhesive layer of the first substrate and sandwich the electronic component and the embedding member,
wherein each of the electrodes of the electronic component is continuous with the conductor circuit through two or more of the conductors.

2. The laminated wiring board according to claim 1, wherein the embedding member has an insulating layer and an adhesive layer that are laminated with an opening portion in which the electronic component is accommodated.

3. The laminated wiring board according to claim 1, wherein the embedding member is made of prepreg having an accommodating recessed portion or an accommodating through hole having a depth corresponding to a height of the electronic component, and allows the electronic component to be arranged in the accommodating recessed portion or the accommodating through hole.

4. The laminated wiring board according to claim 1, wherein two or more of the conductors continuous with each of the electrodes are provided in a straight line in a short-side direction that is perpendicular to a longitudinal direction of the electronic component.

5. The laminated wiring board according to claim 1, wherein two or more of the conductors continuous with each of the electrodes are provided at symmetrical positions about an axis in the longitudinal direction of the electronic component.

6. The laminated wiring board according to claim 3, wherein the prepreg is made of a resin in which an epoxy resin is impregnated in a glass cloth or an aramid nonwoven fabric.

7. The laminated wiring board according to claim 3, wherein the prepreg is made of a laminated body used by laminating a plurality of layers of the prepreg corresponding to the height of the electronic component.

8. The laminated wiring board according to claim 1, wherein the conductors are made of a cured conductive paste containing at least one kind of metallic particle selected from among nickel, silver, and copper, and at least one kind of metallic particle selected from among tin, bismuth, indium, and lead.

9. A manufacturing method for a laminated wiring board, comprising the steps of:
forming via holes in an insulating layer in which a conductor circuit is formed on one surface thereof and an adhesive layer is formed on an other surface thereof, such that two or more of the via holes are provided for each electrode at locations connected to the electrodes of the electronic component, the via holes passing through the adhesive layer and the insulating layer so that the conductor circuit is partially exposed therefrom;
forming a first substrate in which two or more conductors continuous with each of the electrodes of the electronic component are formed by filling the respective via holes with a conductive paste; and
sandwiching the electronic component and an embedding member embedding the electronic component therein between a second substrate and the first substrate having adhesive layers, respectively, so that the adhesive layers face each other, laminating the first substrate and the second substrate so that each of the electrodes is connected to two or more of the conductive paste, the conductive paste being formed in the first substrate, and then integrally joining the laminated body by thermal compression bonding.

10. The manufacturing method for the laminated wiring board according to claim 9, wherein the step of laminating the first substrate and the second substrate includes:
preparing the embedding member including an insulating layer and an adhesive layer laminated and having an opening portion in which the electronic component is accommodated; and
laminating the first substrate and the second substrate having the adhesive layers, respectively, so that the adhesive layers face each other and the electronic component is accommodated in the opening portion of the embedding member.

11. The manufacturing method for the laminated wiring board according to claim 9, wherein the step of laminating the first substrate and the second substrate includes:
causing the first substrate to preliminarily retain the electronic component by connecting two or more of the conductive paste formed in the first substrate to each of the electrodes;
forming the insulating embedding member in which an accommodating recessed portion or an accommodating through hole is formed with a depth corresponding to a height of the electronic component;
bonding the embedding member to the first substrate after arranging the electronic component having the height corresponding to the accommodating recessed portion or the accommodating through hole; and
laminating the first substrate and the second substrate having the adhesive layers, respectively, so that the adhesive layers face each other so as to sandwich the electronic component and the embedding member therebetween.

* * * * *